(12) United States Patent
Han et al.

(10) Patent No.: US 12,738,335 B2
(45) Date of Patent: Sep. 15, 2026

(54) MEMORY DEVICE AND METHOD OF PERFORMING A VERIFY OPERATION OF THE MEMORY DEVICE

(71) Applicant: SK hynix Inc., Icheon-si (KR)

(72) Inventors: Chang Hyun Han, Icheon-si (KR); Moon Soo Sung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 40 days.

(21) Appl. No.: 18/921,890

(22) Filed: Oct. 21, 2024

(65) Prior Publication Data

US 2025/0253003 A1 Aug. 7, 2025

(30) Foreign Application Priority Data

Feb. 5, 2024 (KR) ........................ 10-2024-0017460

(51) Int. Cl.
*G11C 16/10* (2006.01)
*G11C 16/30* (2006.01)
*G11C 16/34* (2006.01)

(52) U.S. Cl.
CPC .......... *G11C 16/3459* (2013.01); *G11C 16/10* (2013.01); *G11C 16/30* (2013.01)

(58) Field of Classification Search
CPC ..... G11C 16/3459; G11C 16/10; G11C 16/30; G11C 16/0483; G11C 16/26
See application file for complete search history.

(56) References Cited

U.S. PATENT DOCUMENTS

2016/0225452 A1* 8/2016 Lee ........................ G11C 16/10
2019/0164616 A1* 5/2019 Nguyen ............. G11C 16/3431

FOREIGN PATENT DOCUMENTS

KR 1020120078228 A 7/2012
KR 1020150091665 A 8/2015

* cited by examiner

*Primary Examiner* — Xiaochun L Chen
(74) *Attorney, Agent, or Firm* — WILLIAM PARK AND ASSOCIATES LTD.

(57) ABSTRACT

Provided herein is a memory device and a method of performing a verify operation of the memory device. The memory device includes a memory cell array including memory cells, a source line discharge transistor configured to couple a source line of the memory cell array to a ground, a voltage generator configured to generate a gate voltage that is applied to a gate of the source line discharge transistor, and a control logic configured to determine the gate voltage depending on changes in threshold voltages of the memory cells in response to a verify operation on the memory cells performed in each of a plurality of program loops and to control the voltage generator to generate the determined gate voltage.

22 Claims, 7 Drawing Sheets

Pulse
PV1
PV2
PL1
PL2
PL3
PL4
PL5
Vg
GND
V1
V1−Vstep1
V1−2×Vstep1
V2
V2−Vstep2

FIG. 5

Bit Line
DST
Cn
Cn-1
. . .
C2
C1
SST
Source Line
$V_g$

Bit Line
CELL STRING
Source Line
Icell
R1
R2

MEMORY DEVICE AND METHOD OF PERFORMING A VERIFY OPERATION OF THE MEMORY DEVICE

CROSS-REFERENCE TO RELATED APPLICATION

The present application claims priority under 35 U.S.C. § 119(a) to Korean patent application number 10-2024-0017460 filed on Feb. 5, 2024, in the Korean Intellectual Property Office, the entire contents of which application is incorporated herein by reference.

BACKGROUND

1. Technical Field

Various embodiments of the present disclosure generally relate to a memory device, and more particularly, to a memory device and a method of performing a verify operation of the memory device.

2. Related Art

Memory devices are classified as volatile memory devices and nonvolatile memory devices. The volatile memory device is a memory device in which data is stored only when power is supplied, and in which stored data is lost when the supply of power is interrupted. The nonvolatile memory device is a memory device in which stored data is retained even when the supply of power is interrupted.

During a verify operation of the memory device, the voltage of a source line may spike and/or drop. During a verify operation of the memory device, the voltage of a source line may vary. During a verify operation of the memory device, the voltage of a source line may bounce or fluctuate. During a verify operation of the memory device, the voltage of a source line may incur a bounce phenomenon. As the voltage of the source line changes, the amount of current flowing through a bit line may vary. The verify operation of the memory device may be performed by sensing the bit line current. Due to the variation in the amount of the bit line current, the accuracy of the result of verification may decrease.

SUMMARY

An embodiment of the present disclosure may provide for a memory device. The memory device may include a memory cell array including memory cells, a source line discharge transistor configured to couple a source line of the memory cell array to a ground, a voltage generator configured to generate a gate voltage that is applied to a gate of the source line discharge transistor, and a control logic configured to determine the gate voltage depending on changes in threshold voltages of the memory cells in response to a verify operation on the memory cells performed in each of a plurality of program loops and to control the voltage generator to generate the determined gate voltage.

An embodiment of the present disclosure may provide for a memory device. The memory device may include a memory cell array including memory cells, a source line discharge transistor configured to couple a source line of the memory cell array to a ground, a voltage generator configured to generate a gate voltage that is applied to a gate of the source line discharge transistor, and a control logic configured to count a number of program-completed memory cells having threshold voltages that have reached target threshold voltages in response to a verify operation on the memory cells performed in each of a plurality of program loops, and to control the voltage generator to generate the gate voltage determined based on the number of program-completed memory cells.

An embodiment of the present disclosure may provide for a method of operating a memory device. The method may include performing a first program loop including a first program pulse apply operation of increasing threshold voltages of memory cells and a first verify operation of verifying whether the threshold voltages of the memory cells have reached target threshold voltages, counting a number of program-completed memory cells having threshold voltages that have reached the target threshold voltages among the memory cells based on a result of the first verify operation, determining, based on the number of program-completed memory cells and a magnitude of a first voltage applied to a gate of a source line discharge transistor for coupling a source line of a memory cell array including the memory cells to a ground during performance of the first verify operation, a first decrement in a gate voltage that is applied to the gate of the source line discharge transistor, and applying a voltage decreased from the first voltage by the first decrement in response to performance of a second verify operation included in a second program loop performed after the first program loop.

BRIEF DESCRIPTION OF THE DRAWINGS

FIG. 5 is a diagram illustrating the influence of source line voltage incurring a bounce phenomenon or fluctuating during a verify operation.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device and a method of performing a verify operation of the memory device, which suppress a bouncing phenomenon in which a source line voltage varies in response to a verify operation of the memory device.

Figure 1:
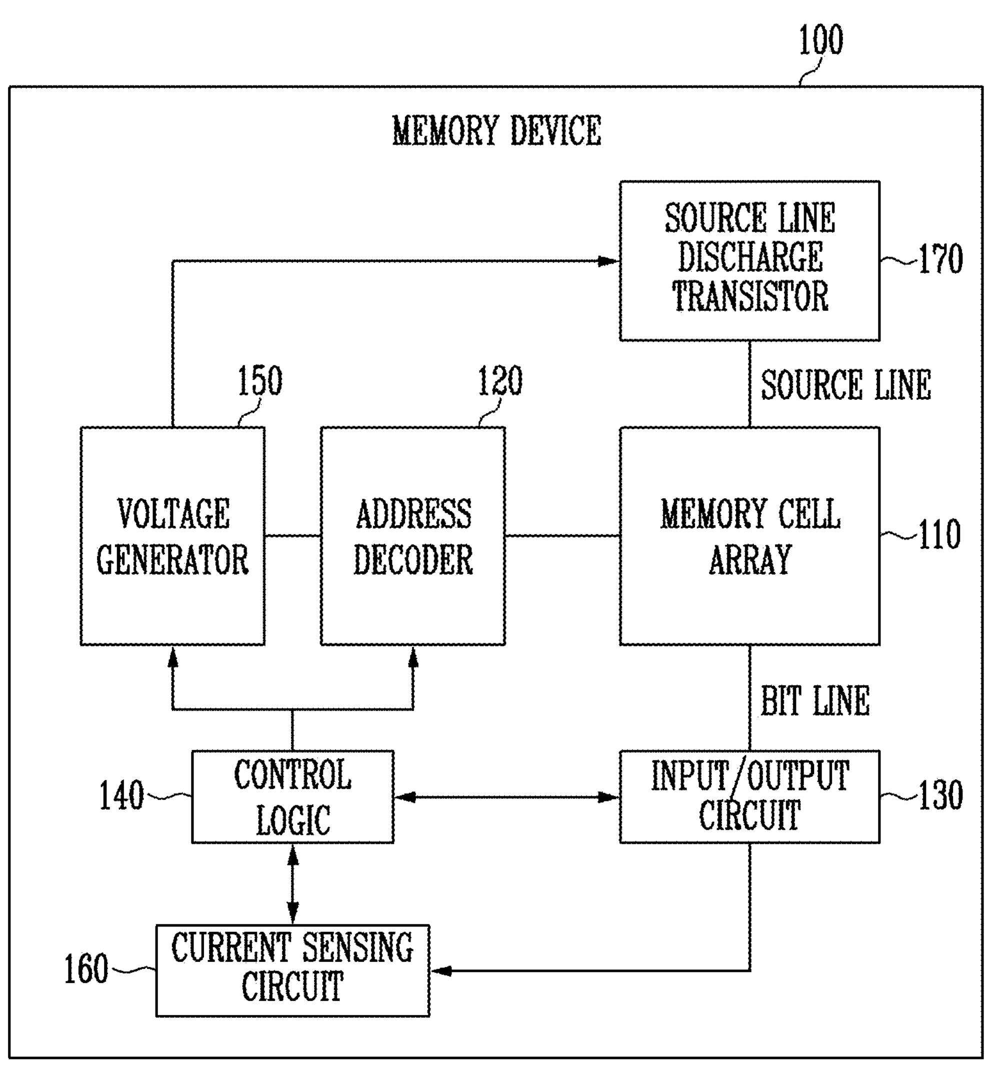
FIG. 1 is a diagram illustrating a memory device according to an embodiment of the present disclosure.

FIG. 1 is a diagram illustrating a memory device according to an embodiment of the present disclosure.

Referring to FIG. 1, a memory device 100 may store data. The memory device 100 may include a memory cell array 110 including memory cells which store data, an address decoder 120 which decodes a column address, an input/output circuit 130 which transmits/receives data to/from an external system of the memory device 100, control logic 140, a voltage generator 150 which generates a plurality of voltages having various voltage levels, a current sensing circuit 160 which senses a sensing current flowing through a bit line during a verify operation, and a source line discharge transistor 170 which couples a source line of the memory cell array 110 to a ground. The control logic 140 may be implemented as hardware, software, or a combination of hardware and software. For example, the control logic 140 may be a control logic circuit operating in accordance with an algorithm and/or a processor executing control logic code.

Each of the memory cells included in the memory cell array 110 may be a single-level cell (SLC) which stores 1-bit data, or a memory cell which stores multi-bit data. The memory cell which stores the multi-bit data may be a multi-level cell (MLC) which stores 2-bit data, a triple-level cell (TLC) which stores 3-bit data, or a quad-level cell (QLC) which stores 4-bit data depending on the number of bits in the multi-bit data.

The address decoder 120 may be coupled to the memory cell array 110 through word lines. The address decoder 120 may be operated under the control of the control logic 140.

The input/output circuit 130 may include page buffers which read data stored in the memory cells and store the read data for a finite amount of time. The input/output circuit 130 may output the data stored in the page buffers to the external system of the memory device 100, or may store data, received from the external system, in the page buffers and then store the data in the memory cells. The page buffers may supply the sensing current to bit lines coupled to the memory cells to sense the threshold voltages of the memory cells during a read operation and a program verify operation. The page buffers may sense variation in the amount of current flowing depending on the program states of the memory cells through a sensing node, and may latch the sensed change as sensing data. The input/output circuit 130 may transfer the latched sensing data to the control logic 140.

The control logic 140 may control the overall operation of the memory device 100. The control logic 140 may generate control signals for controlling the address decoder 120, the input/output circuit 130, the voltage generator 150, and the current sensing circuit 160 so that a read operation, a program operation, and an erase operation are performed on the memory cell array 110. The control logic 140 may determine whether the result of program verification indicates a pass in response to a pass signal or a fail signal received from the current sensing circuit 160.

The voltage generator 150 may generate a gate voltage that is applied to the gate of the source line discharge transistor 170 during a verify operation. The voltage generator 150 may apply the generated gate voltage to the gate of the source line discharge transistor 170 at timing determined in response to a control signal from the control logic 140.

The current sensing circuit 160 may generate a reference current or a reference voltage based on an enable bit received from the control logic 140 during a verify operation. The current sensing circuit 160 may generate a pass signal or a fail signal by comparing the generated reference voltage with a sensing voltage or by comparing the generated reference current with the sensing current.

The source line discharge transistor 170 may function as a switch. When the source line discharge transistor 170 is turned on, the source line of the memory cell array 110 may be coupled to the ground. In an embodiment of the present disclosure, the degree to which the source line voltage changes according to the magnitude of the sensing current during the verify operation may be reduced depending on the gate voltage applied to the source line discharge transistor 170.

In an embodiment of the present disclosure, the control logic 140 may determine the gate voltage depending on the changes in the threshold voltages of the memory cells. The control logic 140 may control the voltage generator 150 to generate the determined gate voltage, and the voltage generator 150 may apply the generated gate voltage to the gate of the source line discharge transistor 170 in response to the verify operation.

In an embodiment of the present disclosure, the control logic 140 may count the number of program-completed memory cells having threshold voltages that have reached target threshold voltages among the memory cells. The control logic 140 may control the voltage generator 150 to generate the determined gate voltage based on the number of program-completed memory cells, and the voltage generator 150 may apply the generated gate voltage to the gate of the source line discharge transistor 170 in response to the verify operation.

In an embodiment of the present disclosure, as the program loops are performed, the number of memory cells having passed a verification may increase. Each of the memory cells having passed the verification may refer to a memory cell, the threshold voltage of which is higher than a verify voltage. As the number of memory cells having threshold voltages higher than the verify voltage increases, the magnitude of the sensing current may decrease. As the magnitude of the sensing current decreases, the degree of variation in the source line voltage may be reduced. The control logic 140 may stepwise decrease the magnitude of the gate voltage that is applied to the gate of the source line discharge transistor 170 as the degree of variation in the source line voltage is reduced.

Figure 2:
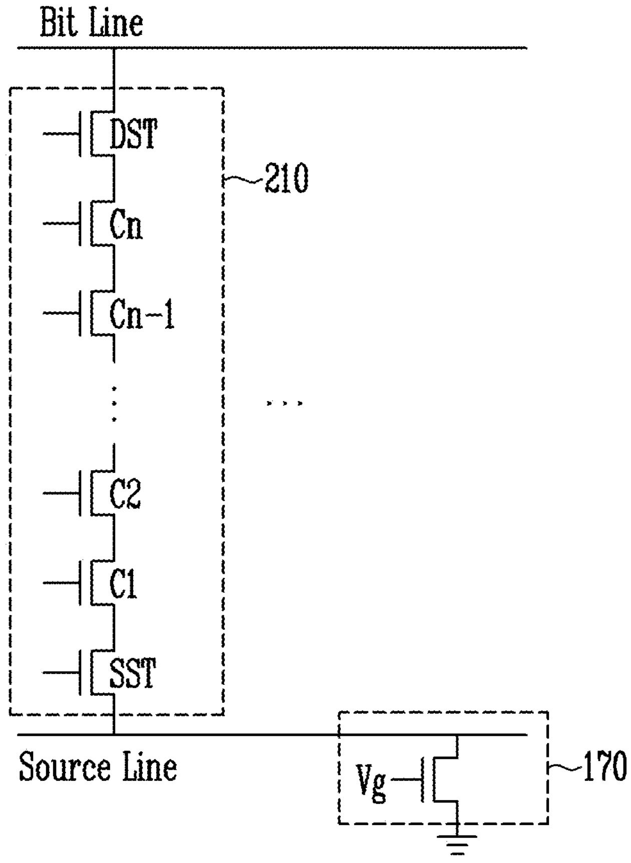
FIG. 2 is a diagram illustrating a source line discharge transistor according to an embodiment of the present disclosure.

FIG. 2 is a diagram illustrating a source line discharge transistor according to an embodiment of the present disclosure.

Referring to FIG. 2, a cell string 210 may be coupled between a bit line and a source line, and a source line discharge transistor 170 may be coupled between a source line and a ground. Although only one cell string is illustrated as the cell string 210 coupled between the bit line and the source line for convenience of description, a plurality of cell strings may be coupled between the bit line and the source line.

The cell string 210 may include a source select transistor SST, n memory cells C1 to Cn, and a drain select transistor DST which are connected in series between the source line and the bit line. The cell string 210 may include at least one source select transistor SST and at least one drain select transistor DST. The number of memory cells included in the cell string 210 may change. In an embodiment, n may be an integer greater than zero.

A source of the source select transistor SST may be coupled to the source line, and a drain of the drain select transistor DST may be coupled to the bit line. The n memory cells C1 to Cn, for a cell string 210, may be connected in series between the source select transistor SST and the drain select transistor DST.

The source line discharge transistor 170 may couple the source line to the ground. When the source line discharge transistor 170 is turned on, the source line may be coupled to the ground. When a voltage equal to or higher than a preset threshold voltage is applied to the gate of the source line discharge transistor 170, the source line discharge transistor 170 may be turned on. In an embodiment of the present disclosure, a gate voltage Vg generated by the voltage generator 150 may be applied to the gate of the source line discharge transistor 170. When the source line discharge transistor 170 is turned off, the source line may be in a floating state. The word "preset" as used herein with respect to a parameter, such as a preset threshold voltage, minimum voltage, time, first period, second period, period, default voltage, and voltage etc., means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In an embodiment of the present disclosure, the voltage of the source line may change depending on the gate voltage Vg applied to the gate of the source line discharge transistor 170. During a verify operation, the level of the source line voltage may become higher by the source line discharge transistor 170. As the applied gate voltage Vg increases, the level of the source line voltage may become lower.

Figure 3:
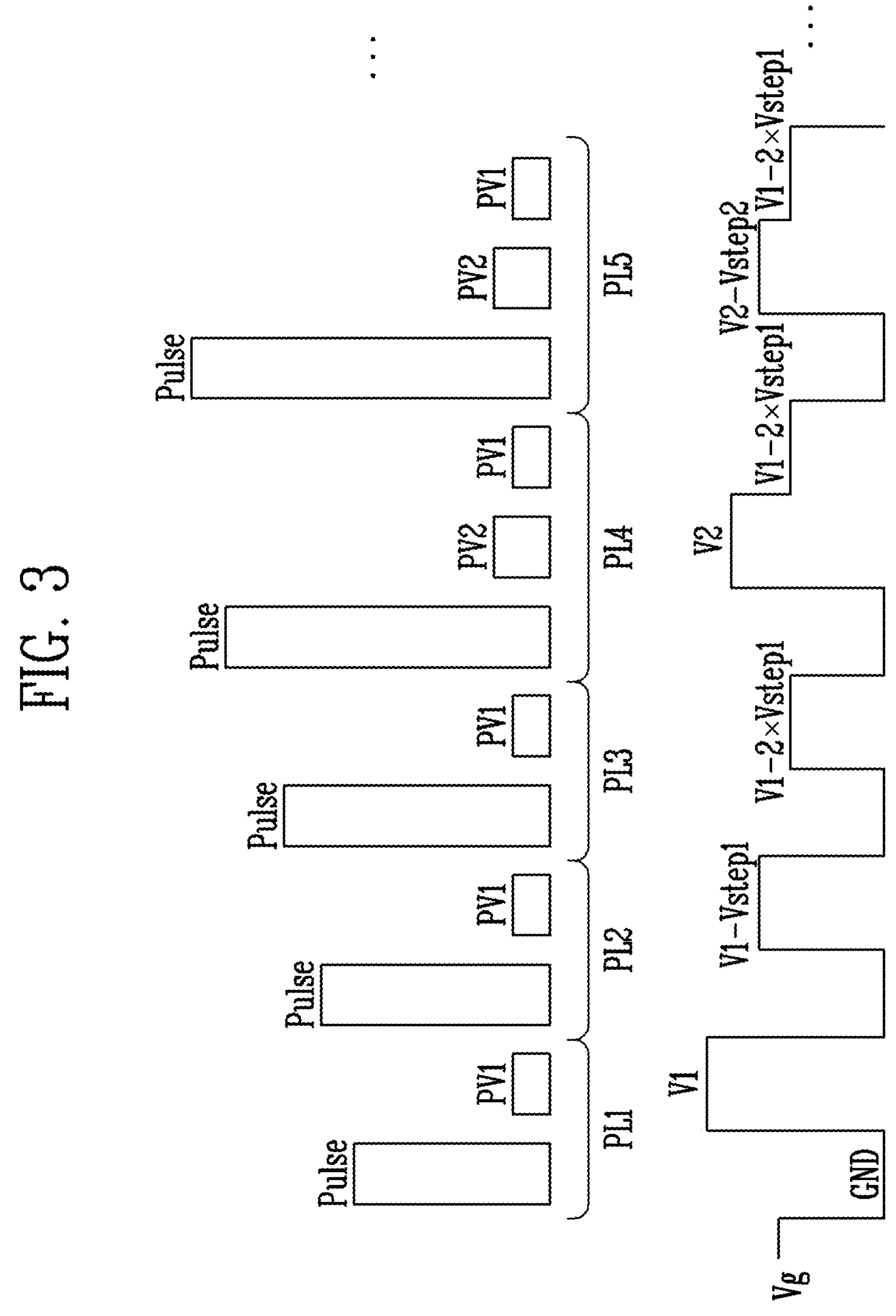
FIG. 3 is a diagram illustrating a voltage applied to a gate of a source line discharge transistor according to an embodiment of the present disclosure.

FIG. 3 is a diagram illustrating a voltage applied to a gate of a source line discharge transistor according to an embodiment of the present disclosure.

Referring to FIG. 3, a plurality of program loops may be performed in the memory device 100. In FIG. 3, when a verify operation included in each of the plurality of program loops is performed, a gate voltage Vg applied to the source line discharge transistor 170 may be illustrated. For convenience of description, it may be assumed that first to fifth program loops PL1 to PL5 are depicted in FIG. 3.

Each program loop may include a program pulse apply operation of increasing the threshold voltages of memory cells and a verify operation of verifying whether the threshold voltages of the memory cells have reached target threshold voltages. During the program pulse apply operation, a ground voltage GND may be applied to the gate of the source line discharge transistor 170. The memory device 100 may perform a plurality of program loops. As the number of program pulse apply operations that are performed increases, the threshold voltages of memory cells may increase. The magnitudes of applied program pulses may be stepwise increased in response to an increase in the number of program loops that are performed.

As the number of program loops that are performed increases, the number of program-completed memory cells having threshold voltages that have reached target threshold voltages may increase. As the number of program-completed memory cells increases, the magnitude of a sensing current flowing through the bit line may decrease. Because an increment in the potential level of the source line decreases as the magnitude of the sensing current decreases, it may be desirable that the magnitude of the gate voltage Vg applied to the gate of the source line discharge transistor 170 decrease.

In an embodiment of the present disclosure, the control logic 140 may determine the gate voltage Vg depending on changes in the threshold voltages of memory cells in response to a verify operation on the memory cells performed in each of the plurality of program loops. The voltage generator 150 may generate the gate voltage Vg and apply the gate voltage Vg to the gate of the source line discharge transistor 170.

The input/output circuit 130 may generate sensing data by sensing a sensing current flowing through the bit line to which the memory cells are coupled. The control logic 140 may detect the changes in the threshold voltages of the memory cells based on the sensing data.

The control logic 140 may decrease the gate voltage Vg in response to the case where the magnitude of the sensing current becomes smaller than the magnitude of a sensing current sensed in a previous program loop. For example, a sensing current sensed in a second verify operation of the second program loop PL2 may be smaller than a sensing current sensed in a first verify operation of the first program loop PL1. The control logic 140 may control the gate voltage applied in response to the second verify operation of the second program loop PL2 to be smaller than the gate voltage applied in response to the first verify operation of the first program loop PL1.

The control logic 140 may determine a decrement in the gate voltage Vg based on variation in the sensing current. The control logic 140 may decrease the gate voltage until the gate voltage Vg reaches a preset minimum voltage in response to the performance of the plurality of program loops. In an embodiment of the present disclosure, the minimum voltage may be a limit voltage applied to the gate of the source line discharge transistor 170 during a read operation. The limit voltage may be equal to or higher than the threshold voltage at which the source line discharge transistor 170 is turned on. The control logic 140 may stepwise decrease the gate voltage Vg in response to the performance of the plurality of program loops.

For example, the control logic 140 may determine the decrement in the gate voltage Vg to be a first decrement Vstep1 based on the variation in the sensing current. The control logic 140 may apply a first voltage V1 to the gate of the source line discharge transistor 170 in response to the first verify operation, and may apply a voltage decreased from the first voltage V1 by the first decrement Vstep1 to the gate of the source line discharge transistor 170 in response to the second verify operation. Similarly, the control logic 140 may apply a voltage decreased from the first voltage V1 by twice the first decrement Vstep1 to the gate of the source line discharge transistor 170 in response to a third verify operation of the third program loop.

In FIG. 3, the limit voltage applied to the gate of the source line discharge transistor 170 during a read operation may be assumed to be V1−2*Vstep1. In program loops performed after the third program loop PL3, the limit voltage is applied to the gate of the source line discharge transistor 170 in response to a first verify voltage PV1, and a voltage lower than the limit voltage is not applied to the gate of the source line discharge transistor 170.

One or more verify voltages may be applied during the performance of each verify operation. The gate voltage Vg corresponding to each of the verify voltages may be applied to the gate of the source line discharge transistor 170. The gate voltage Vg applied to the gate of the source line discharge transistor 170 may vary with each verify voltage. For example, in the first to fifth program loops PL1 to PL5, verify operations for the first verify voltage PV1 may be performed, and in the fourth program loop PL4 or a higher program loop, verify operations for the second verify voltage PV2 may be performed. In the first program loop PL1, the first voltage V1 may be applied to the gate of the source line discharge transistor 170 in response to the first verify voltage PV1. In the fourth program loop PL4, the second voltage V2 may be applied to the gate of the source line discharge transistor 170 in response to the second verify voltage PV2.

The control logic 140 may control the second voltage V2 to be applied to the gate of the source line discharge transistor 170 in the fourth program loop PL4 in response to the second verify voltage PV2. As in the case of the first verify voltage PV1, the control logic 140 may determine the decrement in the gate voltage Vg to be a second decrement Vstep2 based on the variation in the sensing current. In an embodiment of the present disclosure, the first decrement Vstep1 and the second decrement Vstep2 may be different from each other. During the fifth verify operation of the fifth program loop PL5, a voltage decreased from the second voltage V2 by the second decrement Vstep2 may be applied to the gate of the source line discharge transistor 170. During the verify operation performed after the fourth program loop PL4, a voltage decreased from the second voltage V2 by a multiple of the second decrement Vstep2 may be applied to the gate of the source line discharge transistor 170. The gate voltage Vg applied to the gate of the source line discharge transistor 170 in response to the second verify voltage PV2 may be stepwise decreased to the limit voltage.

In an embodiment of the present disclosure, the control logic 140 may count the number of program-completed memory cells having threshold voltages that have reached target threshold voltages among memory cells in response to the verify operation on the memory cells performed in each of the plurality of program loops. The control logic 140 may determine the gate voltage Vg applied to the gate of the source line discharge transistor 170 based on the counted number of program-completed memory cells. The control logic 140 may count the number of program-completed memory cells based on sensing data that is generated by sensing the sensing current. The control logic 140 may control the gate voltage Vg to be decreased in response to the increase in the number of program-completed memory cells. The control logic 140 may determine the decrement in the gate voltage based on the increase rate of the number of program-completed memory cells. The control logic 140 may stepwise decrease the gate voltage Vg until the gate voltage reaches a preset minimum voltage.

Figure 4:
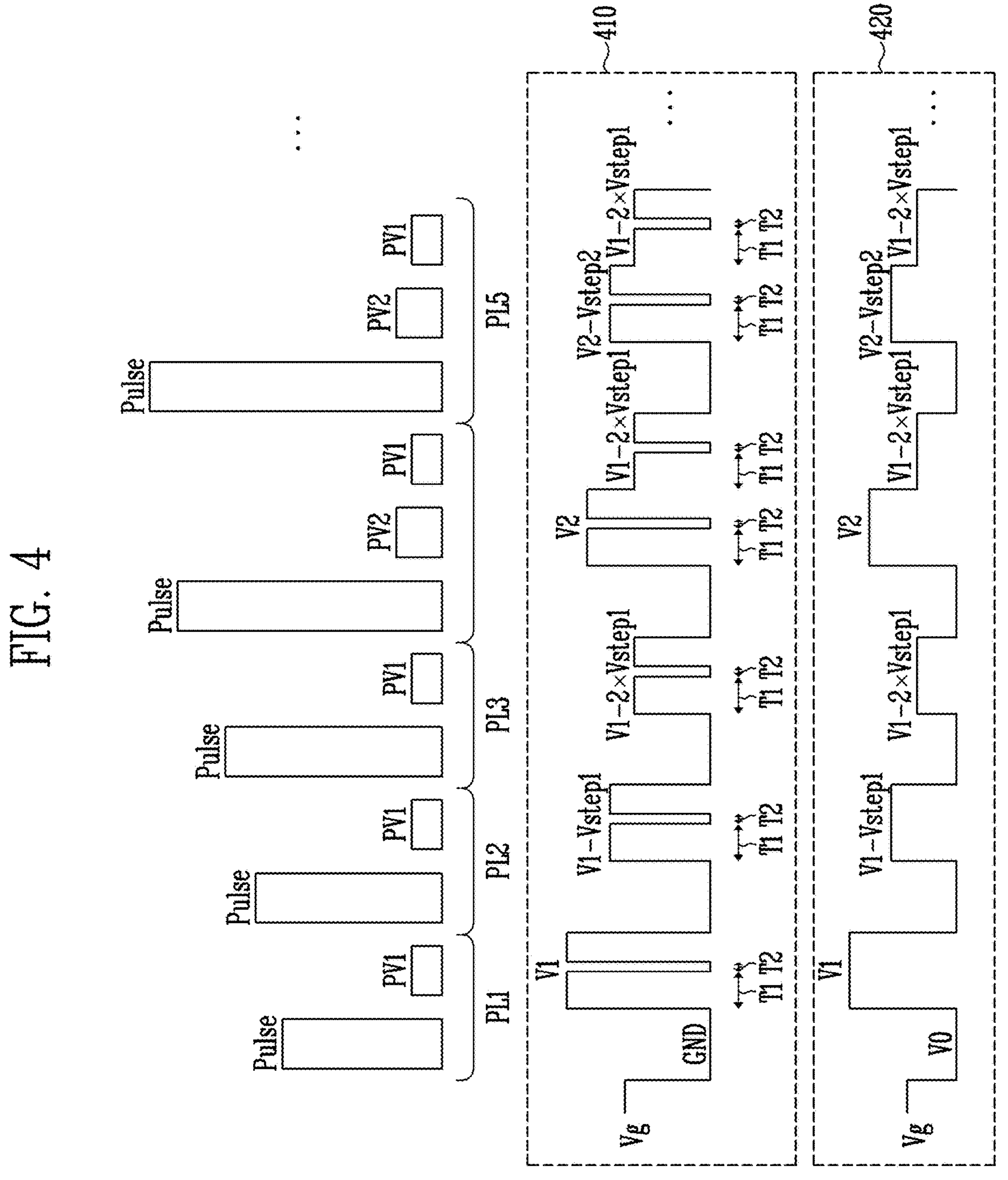
FIG. 4 is a diagram illustrating a voltage applied to a gate of a source line discharge transistor according to an embodiment of the present disclosure.

FIG. 4 is a diagram illustrating a voltage applied to a gate of a source line discharge transistor according to an embodiment of the present disclosure.

Referring to FIG. 4, a case 410 where the source line discharge transistor 170 is turned off for a preset time in response to a verify operation and a case 420 where a default voltage V0 is applied to the gate of the source line discharge transistor 170 during a program pulse apply operation may be illustrated. In the description of FIG. 4, the description of portions identical to those of FIG. 3 may be omitted.

In an embodiment of the present disclosure, the control logic 140 may control the voltage generator 150 to adjust the magnitude and timing of the gate voltage Vg applied to the gate of the source line discharge transistor 170. In the case 410 where the source line discharge transistor 170 is turned off for the preset time, the gate voltage Vg may be applied during a preset first period T1, and the source line discharge transistor 170 may be turned off during a preset second period T2 after the first period T1.

In an embodiment of the present disclosure, the second period T2 during which the source line discharge transistor 170 is turned off may be shorter than the first period T1. The second period T2 during which the source line discharge transistor 170 is turned off and the first period T1 during which the gate voltage Vg is applied before the source line discharge transistor 170 is turned off may be uniform regardless of the magnitude of the verify voltage or the program loop.

Because the source line is floating or in a floating state while the source line discharge transistor 170 is turned off, current consumption occurring during the verify operation may decrease.

In an embodiment of the present disclosure, the control logic 140 may control the default voltage V0 to be applied to the gate of the source line discharge transistor 170 in response to the application of a program pulse. In the case 420 where the default voltage V0 is applied to the gate of the source line discharge transistor 170, the ground voltage GND may be applied to the source line. Although the ground voltage GND is applied to the source line and then channel off characteristics of the source line discharge transistor 170 are not improved, a current flowing through the source line may decrease, with the result that current consumption may decrease. The default voltage V0 may be equal to or higher than the threshold voltage at which the source line discharge transistor 170 is turned on.

Figure 5:
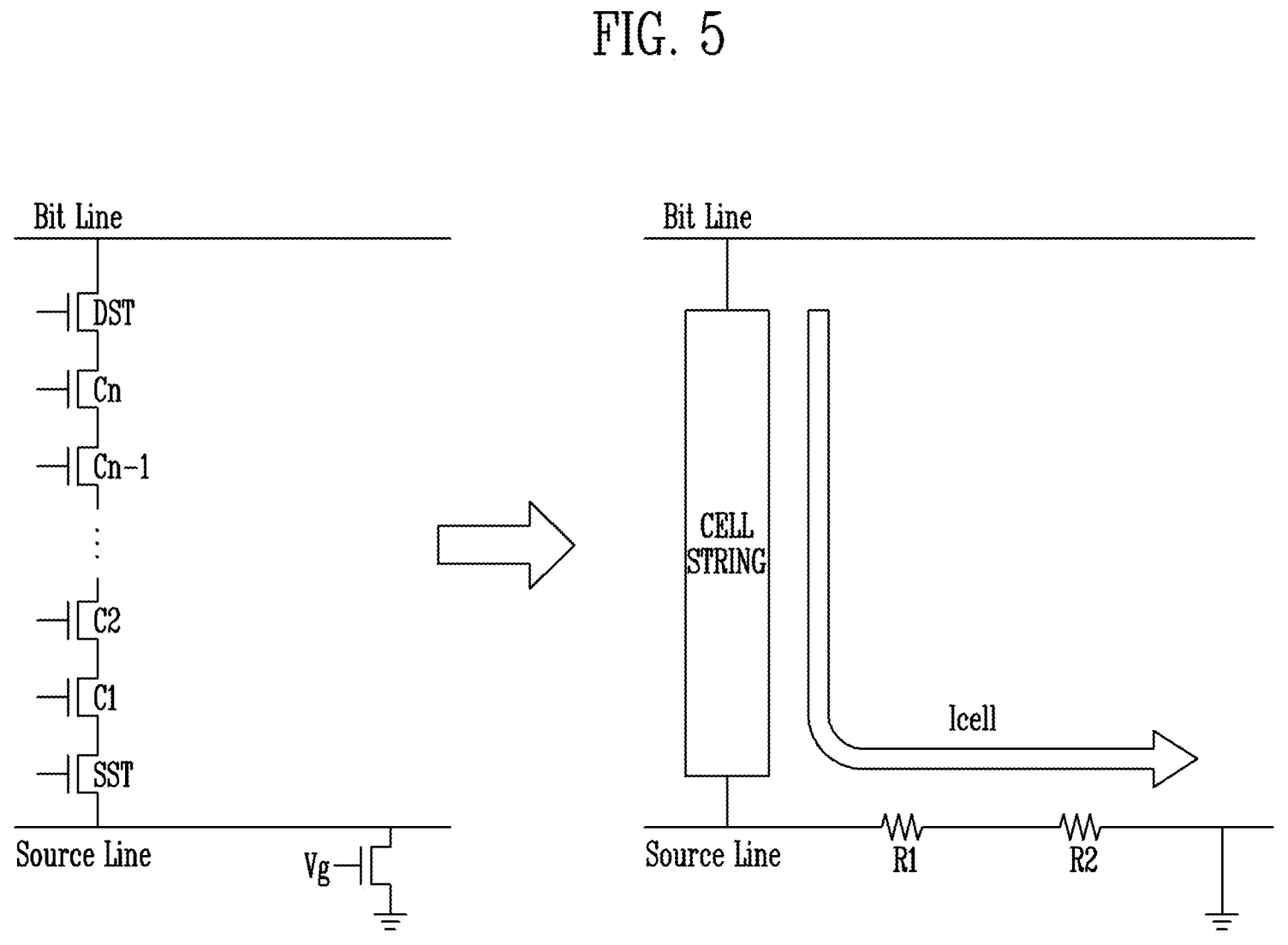

FIG. 5 is a diagram illustrating the influence of source line voltage bouncing, incurring a bounce phenomenon, and/or fluctuating during a verify operation.

Referring to FIG. 5, a portion of a memory device 100 in which a cell string is coupled between a bit line and a source line, and a source line discharge transistor is coupled between the source line and a ground is illustrated. During the verify operation, the resistance of a conducting wire (line) may be indicated by R1, and the resistance of a source line discharge transistor 170 may be indicated by R2. In an embodiment of the present disclosure, it may be assumed that R2 is greater than R1.

When a plurality of program loops are performed, the threshold voltages of memory cells may increase. As the threshold voltages of the memory cells increase, the amount of a sensing current Icell flowing through the bit line may decrease. Because the amount of sensing current decreases as the program loops are performed, the amount of the sensing current Icell flowing through the bit line during the verify operations of program loops that are initially performed among the plurality of program loops may be larger than the amount of sensing current Icell flowing through the bit line during the verify operations of program loops that are subsequently performed.

A source line voltage may be determined by the product of the sensing current Icell and the total resistance that is the sum of R1 and R2. Because the amount of the sensing current Icell changes as the program loops are performed, the source line voltage may vary with the performance of the program loops. Source line voltage bouncing may refer to a phenomenon in which, with the performance of the program loops, the voltage of the source line changes. The source line voltage bouncing may reduce the accuracy of a verification result.

Because the magnitude of the sensing current Icell decreases as the number of program loops that are performed increases, the level of the source line voltage may be high in an initial stage of program loops, and may become lower as the program loops are performed. During the verify operations of program loops that are initially performed, the magnitude of the sensing current Icell may be detected as being smaller than an actual sensing current due to the source line voltage that becomes relatively high. In the initial stage of the program loops, the threshold voltages of the memory cells do not reach target threshold voltages, and thus a verification pass may be achieved due to the sensing current Icell that is detected as being smaller than the actual sensing current even if the program operation is not completed.

Further, because the source line voltage decreases due to the sensing current Icell, the magnitude of which decreases as the number of program loops that are performed increases, the magnitude of the sensing current Icell may be detected as being larger than the actual sensing current. In a subsequent stage of the program loops, the verification result may be determined to be a verification fail due to the sensing current Icell detected as being larger than the actual sensing current even if the threshold voltages of the memory cells have reached the target threshold voltages. In order to improve the accuracy of the verification result, in some embodiments, there is a need to reduce the influence of source line voltage bouncing.

In an embodiment of the present disclosure, the magnitude of the equivalent resistance R2 of the source line discharge transistor may be in inverse proportion to the magnitude of the gate voltage Vg applied to the gate of the source line discharge transistor. The control logic may apply a relatively high voltage to the gate of the source line discharge transistor to decrease the source line voltage during the verify operations of program loops that are initially performed, and may decrease the magnitude of the voltage applied to the gate of the source line discharge transistor as the number of program loops that are performed increases. That is, the gate voltage Vg may decrease as the number of program loops that are performed increases.

According to an embodiment of the present disclosure, a relatively high voltage may be applied to the gate of the source line discharge transistor during the verify operations of program loops that are initially performed, whereby an increase in the source line voltage may be suppressed. Due thereto, in an embodiment, because the detected sensing current Icell is not decreased, the accuracy of the verification result may be improved. Furthermore, in an embodiment, because the voltage applied to the gate of the source line discharge transistor decreases as the number of program loops that are performed increases, the source line voltage may increase. Due thereto, in an embodiment, the detected sensing current Icell is not increased, whereby the accuracy of the verification result may be improved.

Figure 6:
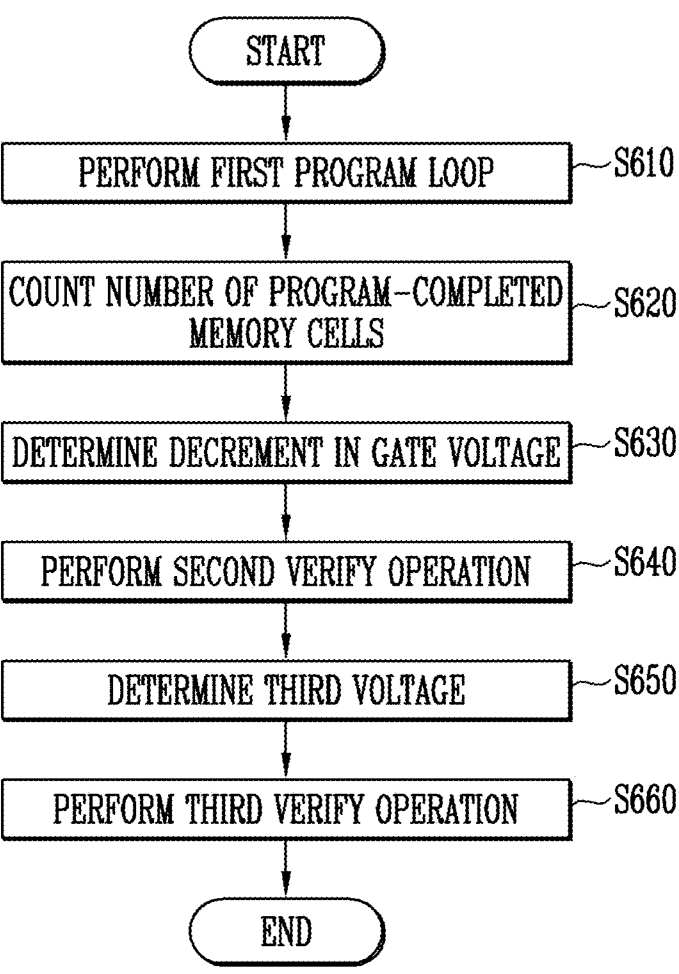
FIG. 6 is a flowchart illustrating a method of performing a verify operation according to an embodiment of the present disclosure.

FIG. 6 is a flowchart illustrating a method of performing a verify operation according to an embodiment of the present disclosure.

Referring to FIG. 6, in an embodiment, the accuracy of a verification result may be improved by stepwise decreasing a voltage that is applied to a gate of a source line discharge transistor in response to a verify operation on memory cells performed in each of a plurality of program loops. In FIG. 6, it may be assumed that first to third program loops are performed. Although verify operations corresponding to a first verify voltage are described, this description is only an embodiment, and verify operations corresponding to a plurality of verify voltages may be performed in one program loop.

At step S610, the memory device may perform a first program loop including a first program pulse apply operation and a first verify operation. The first program pulse apply operation may increase the threshold voltages of memory cells. The first verify operation may be an operation of verifying whether the threshold voltages of the memory cells have reached target threshold voltages.

At step S620, the control logic may count the number of program-completed memory cells having threshold voltages that have reached the target threshold voltages among the memory cells based on the result of the first verify operation. The control logic may determine the number of program-completed memory cells based on a sensing current flowing through a bit line to which the memory cells are coupled.

At step S630, the control logic may be configured to, based on the number of program-completed memory cells and the magnitude of a first voltage applied to the gate of the source line discharge transistor for coupling the source line of a memory cell array including the memory cells to the ground during the performance of the first verify operation, determine a first decrement in a gate voltage applied to the gate of the source line discharge transistor. The control logic may determine the degree of increase in the number of program-completed memory cells based on the variation in the sensing current. The control logic may increase the first decrement based on the degree of increase in the number of program-completed memory cells.

At step S640, the memory device may perform a second verify operation included in a second program loop performed after the first program loop. The control logic may control a second voltage decreased from the first voltage by the first decrement to be applied to the gate of the source line discharge transistor in response to the second verify operation.

At step S650, the control logic may determine a third voltage to be applied to the gate of the source line discharge transistor when performing a third verify operation included in a third program loop performed after the second program loop in response to the result of the second verify operation indicating a verification fail. The control logic may determine a voltage decreased from the second voltage by the first decrement to be the third voltage. In response to the case where the voltage decreased from the second voltage by the first decrement is lower than a limit voltage applied to the gate of the source line discharge transistor during a read operation, the control logic may determine the third voltage to be the limit voltage.

At step S660, the memory device may perform a third verify operation. The control logic may control the third voltage to be applied to the source line discharge transistor.

The descriptions of respective steps in FIG. 6 may correspond to the descriptions of FIGS. 2 and 3.

Figure 7:
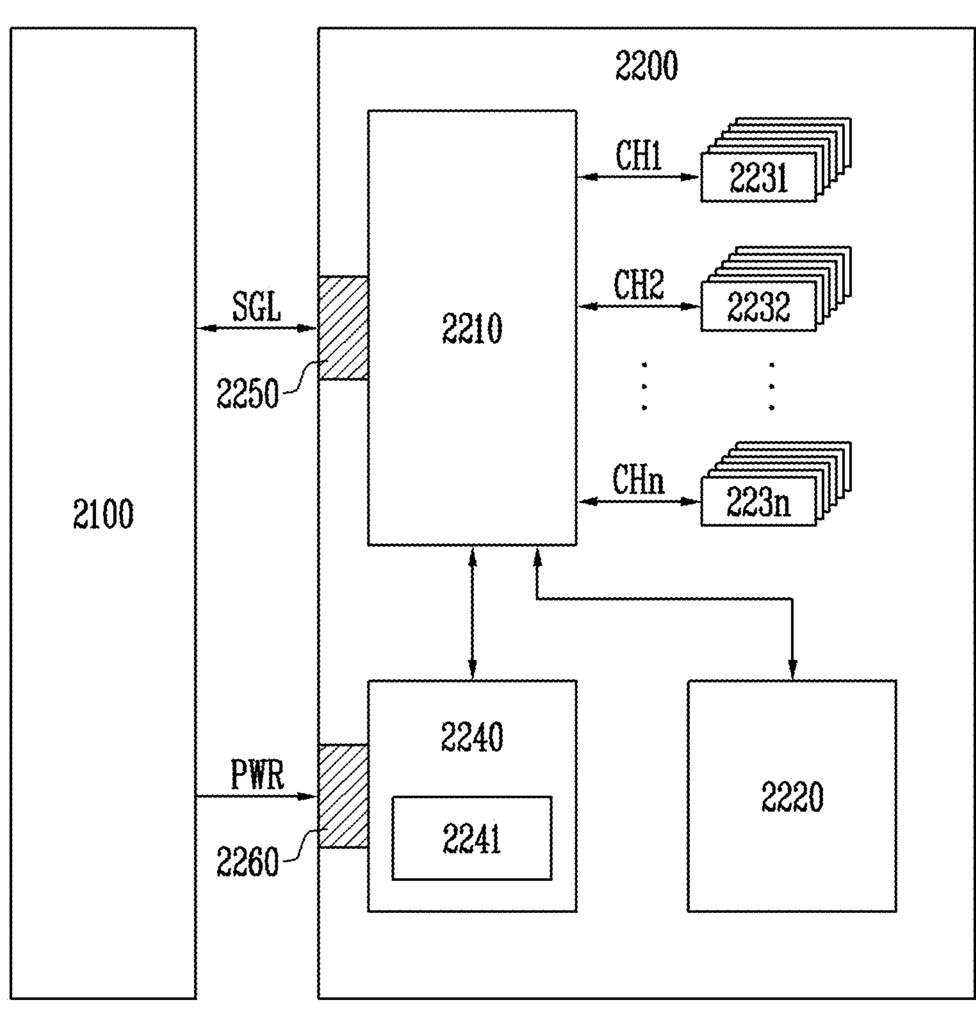
FIG. 7 is a diagram illustrating an example of a data processing system including a memory device according to an embodiment of the present disclosure.

FIG. 7 is a diagram illustrating an example of a data processing system including a memory device according to an embodiment of the present disclosure.

Referring to FIG. 7, a data processing system 2000 may include a host device 2100 and a solid state drive (SSD) 2200.

The SSD 2200 may include a controller 2210, a buffer memory device 2220, nonvolatile memories 2231 to **223*n*, a power supply 2240, a signal connector 2250, and a power connector 2260**.

The buffer memory device 2220 may store data, for a finite amount of time, to be stored in the nonvolatile memories 2231 to **223*n*. Also, the buffer memory device 2220 may store data, for a finite amount of time, read from the nonvolatile memories 2231 to 223*n*. The data stored, for the finite amount of time, in the buffer memory device 2220 may be transmitted to the host device 2100 or the nonvolatile memories 2231 to 223*n* under the control of the controller 2210**.

The nonvolatile memories 2231 to **223*n* may be used as storage media of the SSD 2200. The nonvolatile memories 2231 to 223*n* may be coupled to the controller 2210 through a plurality of channels CH1 to CHn, respectively. One or more nonvolatile memories may be coupled to one channel. The nonvolatile memories coupled to one channel may be coupled to the same signal bus and the same data bus. In an embodiment of the present disclosure, each of the nonvolatile memories 2231 to 223*n*** may include memory cells connected in series between a bit line and a source line, and may include a source line discharge transistor for coupling the source line to a ground.

The controller 2210 may control the overall operation of the SSD 2200. The controller 2210 may exchange a signal SGL with the host device 2100 through the signal connector 2250. Here, the signal SGL may include a command, an address, data, etc. The signal connector 2250 may be implemented as various types of connectors depending on the interface scheme between the host device 2100 and the SSD 2200.

The power supply 2240 may provide power PWR received through the power connector 2260 into the SSD 2200. The power supply 2240 may include an auxiliary power supply 2241. When a sudden power-off occurs, the auxiliary power supply 2241 may supply power so that the SSD 2200 normally shuts off. The auxiliary power supply 2241 may include large-capacity capacitors capable of charging power PWR.

In an embodiment of the present disclosure, the SSD 2200 may perform a program operation including a plurality of program loops. The SSD 2200 may determine the gate voltage of the source line discharge transistor depending on the changes in the threshold voltages of memory cells in response to a verify operation on the memory cells performed in each of the plurality of program loops. The SSD 2200 may stepwise decrease the voltage that is applied to the gate of the source line discharge transistor as the number of program loops that are performed increases. The SSD 2200 may count the number of program-completed memory cells having threshold voltages that have reached target threshold voltages by sensing a sensing current flowing through the bit line during the verify operation. The SSD 2200 may determine a decrement in the voltage that is applied to the gate of the source line discharge transistor based on the number of program-completed memory cells.

According to an embodiment of the present disclosure, there can be provided a memory device and a method of performing a verify operation of the memory device, which can perform a verify operation in response to the influence of source line voltage bouncing that decreases as program loops are performed by applying a gate voltage that is stepwise decreased to a gate of a source line discharge transistor for coupling a memory cell array to a ground.

The scope of the present disclosure is defined by the accompanying claims, rather than by the detailed description, and all modifications or changes derived from the meaning and scope of the claims and equivalents thereof should be construed as falling within the scope of the present disclosure.

What is claimed is:

1. A memory device, comprising:
- a memory cell array including memory cells;
- a source line discharge transistor configured to couple a source line of the memory cell array to a ground;
- a voltage generator configured to generate a gate voltage that is applied to a gate of the source line discharge transistor; and
- a control logic configured to determine the gate voltage depending on changes in threshold voltages of the memory cells in response to a verify operation on the memory cells performed in each of a plurality of program loops and to control the voltage generator to generate the determined gate voltage.

2. The memory device according to claim 1, further comprising:
- a current sensing circuit configured to sense a sensing current flowing through a bit line to which the memory cells are coupled,
- wherein the control logic is configured to detect the changes in the threshold voltages of the memory cells based on a result of sensing of the sensing current.

3. The memory device according to claim 2, wherein the control logic is configured to generate a control signal for decreasing the gate voltage in response when a magnitude of the sensing current becomes smaller than a magnitude of a sensing current sensed in a previous program loop.

4. The memory device according to claim 3, wherein the control logic is configured to determine a decrement in the gate voltage based on a variation in the sensing current.

5. The memory device according to claim 3, wherein the control logic is configured to generate a control signal for decreasing the gate voltage until the gate voltage reaches a preset minimum voltage in response when the plurality of program loops are performed.

6. The memory device according to claim 5, wherein:
- the minimum voltage is a limit voltage applied to the gate of the source line discharge transistor during a read operation, and
- the limit voltage is equal to or greater than a threshold voltage at which the source line discharge transistor is turned on.

7. The memory device according to claim 5, wherein the control logic is configured to generate a control signal for stepwise decreasing the gate voltage in response when the plurality of program loops are performed.

8. The memory device according to claim 1, wherein:
- the voltage generator is configured to apply a program pulse for increasing the threshold voltages of the memory cells in each of the plurality of program loops,
- the control logic is configured to control the voltage generator to apply a preset default voltage to the gate of the source line discharge transistor in response to application of the program pulse, and
- the default voltage is equal to or greater than a threshold voltage at which the source line discharge transistor is turned on.

9. The memory device according to claim 1, wherein:
- the control logic is configured to control the source line discharge transistor to be turned off during a second period after a first period has elapsed from application of the gate voltage to the gate of the source line discharge transistor, and
- the second period is shorter than the first period.

10. The memory device according to claim 1, wherein the control logic is configured to generate a control signal for decreasing the gate voltage based on a number of times the plurality of program loops have been performed.

11. A memory device, comprising:
- a memory cell array including memory cells;
- a source line discharge transistor configured to couple a source line of the memory cell array to a ground;
- a voltage generator configured to generate a gate voltage that is applied to a gate of the source line discharge transistor; and a control logic configured to count a number of program-completed memory cells having threshold voltages that have reached target threshold voltages in response to a verify operation on the memory cells performed in each of a plurality of program loops, and to control the voltage generator to generate the gate voltage determined based on the number of program-completed memory cells.

12. The memory device according to claim 11, further comprising:

a current sensing circuit configured to sense a sensing current flowing through a bit line to which the memory cells are coupled, wherein the control logic is configured to count the number of program-completed memory cells based on a result of sensing of the sensing current.

13. The memory device according to claim 12, wherein the control logic is configured to control the voltage generator to decrease the gate voltage in response when the number of program-completed memory cells is greater than a number of program-completed memory cells counted in a previous program loop.

14. The memory device according to claim 13, wherein the control logic is configured to determine a decrement in the gate voltage based on an increase rate of the number of program-completed memory cells.

15. The memory device according to claim 13, wherein the control logic is configured to control the voltage generator to decrease the gate voltage until the gate voltage reaches a preset minimum voltage in response when the plurality of program loops are performed.

16. The memory device according to claim 15, wherein the control logic is configured to control the voltage generator to stepwise decrease the gate voltage in response when the plurality of program loops are performed.

17. A method of operating a memory device, comprising:

performing a first program loop including a first program pulse apply operation of increasing threshold voltages of memory cells and a first verify operation of verifying whether the threshold voltages of the memory cells have reached target threshold voltages;

counting a number of program-completed memory cells having threshold voltages that have reached the target threshold voltages among the memory cells based on a result of the first verify operation;

determining, based on the number of program-completed memory cells and a magnitude of a first voltage applied to a gate of a source line discharge transistor for coupling a source line of a memory cell array including the memory cells to a ground during performance of the first verify operation, a first decrement in a gate voltage that is applied to the gate of the source line discharge transistor; and applying a voltage decreased from the first voltage by the first decrement in response to performance of a second verify operation included in a second program loop performed after the first program loop.

18. The method according to claim 17, wherein counting the number comprises:

determining the number of program-completed memory cells based on a sensing current flowing through a bit line to which the memory cells are coupled.

19. The method according to claim 18, wherein determining the first decrement comprises:

determining a degree of increase in the number of program-completed memory cells based on a variation in the sensing current; and increasing the first decrement based on the degree of increase in the number of program-completed memory cells.

20. The method according to claim 17, further comprising:

determining a third voltage to be applied to the gate of the source line discharge transistor during performance of a third verify operation included in a third program loop performed after the second program loop in response to a result of the second verify operation indicating a verification fail; and performing the third verify operation by applying the third voltage to the gate of the source line discharge transistor.

21. The method according to claim 20, wherein determining the third voltage comprises:

determining a voltage decreased from the second voltage by the first decrement to be the third voltage.

22. The method according to claim 21, wherein determining the third voltage further comprises:

determining the third voltage to be the limit voltage in response when the voltage decreased from the second voltage by the first decrement is lower than a limit voltage applied to the gate of the source line discharge transistor during a read operation.

* * * * *